United States Patent
Jiang et al.

(10) Patent No.: US 11,856,716 B2
(45) Date of Patent: Dec. 26, 2023

(54) DISPLAY PANEL AND DISPLAY SCREEN

(71) Applicant: UNILUMIN GROUP CO., LTD, Shenzhen (CN)

(72) Inventors: Xiaosheng Jiang, Shenzhen (CN); Song Lei, Shenzhen (CN)

(73) Assignee: UNILUMIN GROUP CO., LTD, Shenzhen (CN)

( * ) Notice: Subject to any disclaimer, the term of this patent is extended or adjusted under 35 U.S.C. 154(b) by 0 days.

(21) Appl. No.: 17/872,280

(22) Filed: Jul. 25, 2022

(65) Prior Publication Data

US 2023/0063664 A1 Mar. 2, 2023

(30) Foreign Application Priority Data

Aug. 25, 2021 (CN) .......................... 202122026348.6

(51) Int. Cl.
*H05K 5/00* (2006.01)
*H05K 5/02* (2006.01)

(52) U.S. Cl.
CPC ......... *H05K 5/0021* (2013.01); *H05K 5/0018* (2022.08); *H05K 5/0221* (2013.01)

(58) Field of Classification Search
CPC .. H05K 5/0021; H05K 5/0018; H05K 5/0221; H05K 5/0017; H05K 5/0217
USPC ................ 361/731, 728, 730, 807, 809, 810
See application file for complete search history.

(56) References Cited

U.S. PATENT DOCUMENTS

| | | | |
|---|---|---|---|
| 2019/0355284 A1 | 11/2019 | Cheng et al. | |
| 2023/0096344 A1* | 3/2023 | Liu | G09F 9/3026 361/807 |

FOREIGN PATENT DOCUMENTS

| CN | 203573593 | * | 4/2014 | ............... G09F 9/33 |
|---|---|---|---|---|
| CN | 106448479 | * | 2/2017 | ............... H05K 5/02 |
| CN | 206558156 | * | 10/2017 | ............... H05K 7/18 |
| CN | 108230932 | * | 6/2018 | ............... H05K 5/06 |
| CN | 209765922 U | | 12/2019 | |
| CN | 210745779 U | | 6/2020 | |
| CN | 211820282 U | | 10/2020 | |
| CN | 213070460 | * | 4/2021 | ............... H05K 5/02 |
| CN | 213400355 U | | 6/2021 | |
| CN | 213716389 U | | 7/2021 | |
| CN | 210378234 | * | 7/2022 | ............... G09F 9/33 |

OTHER PUBLICATIONS

Extended European Search Report issued in counterpart European Patent Application No. 22186930.8, dated Feb. 8, 2023.

* cited by examiner

*Primary Examiner* — Hung S. Bui
(74) *Attorney, Agent, or Firm* — Westbridge IP LLC

(57) ABSTRACT

Disclosed are a display panel and a display screen. The display panel includes a plurality of display modules and a cabinet. The plurality of display modules are distributed in a matrix and are fixed in front of the cabinet. The cabinet is provided with two display module openings and a power supply assembly opening. A protective cover plate is installed in front of the cabinet to cover the power supply assembly opening and form a power supply assembly cavity behind the cabinet, which is configured to install a power supply assembly. Two module opening cover plates are installed behind the cabinet to cover the two display module openings in a one-to-one correspondence.

14 Claims, 4 Drawing Sheets

DISPLAY PANEL AND DISPLAY SCREEN

CROSS-REFERENCE TO RELATED APPLICATIONS

This application claims priority to Chinese Patent Application No. 202122026348.6, filed on Aug. 25, 2021, the entire disclosure of which is incorporated herein by reference.

TECHNICAL FIELD

The present disclosure relates to the technical field of display screens, and in particular, to a display panel and a display screen.

BACKGROUND

Nowadays, a light-emitting diode (LED) display screen is generally spliced by multiple display panels. The display panel includes multiple display modules, a HUB control board, a power supply assembly, and other parts. If a part of the LED display screen is broken during use, it needs to be maintained. At present, based on the structure of the existing display panel, for the same display panel, generally, the user can only stand in front of the display panel to maintain the parts, or can only stand behind the display panel to maintain the parts, or can stand in front of the display panel to maintain the display modules and stand behind the display panel to maintain other parts. It can be seen that, for the same display panel, the user cannot both stand in front of the display panel to maintain the parts, and stand behind the display panel to maintain the parts, which easily affects the user experience.

SUMMARY

The main purpose of the present disclosure is to provide a display panel and a display screen, which aims to solve the technical problem that for the same display panel, the user cannot both stand in front of the display panel to maintain the parts, and stand behind the display panel to maintain the parts, which easily affects the user experience.

In order to achieve the above objective, the present disclosure provides a display panel, including: a plurality of display modules; and a cabinet. The plurality of display modules are distributed in a matrix, and are fixed in front of the cabinet. The cabinet is provided with two display module openings and a power supply assembly opening, and the two display module openings are provided at two sides of the power supply assembly opening. A protective cover plate is installed in front of the cabinet to cover the power supply assembly opening and form a power supply assembly cavity behind the cabinet, which is configured to install a power supply assembly. Two module opening cover plates are installed behind the cabinet to cover the two display module openings in a one-to-one correspondence.

In an embodiment, the display panel further includes a HUB control board, the HUB control board is installed in front of the cabinet, and the HUB control board is adjacent to the two display module openings.

In an embodiment, the power supply assembly includes a power supply box and a power supply module, the power supply module is fixed on a side surface of the power supply box facing the protective cover plate, and an edge of the power supply box is fastened with the rear side of the cabinet through a plurality of first screws.

In an embodiment, the plurality of first screws are screws tightened from the rear side of the cabinet.

In an embodiment, a plurality of reinforcing ribs are provided on the side surface of the power supply box away from the protective cover plate.

In an embodiment, edges of the two module opening cover plates are fastened to the rear side of the cabinet through the plurality of first screws.

In an embodiment, the display module includes a bottom shell and at least one printed circuit board (PCB) module with LEDs, and the at least one PCB module with LEDs is fixed in front of the bottom shell.

In an embodiment, the display module further includes a HUB, and an edge of the HUB is fixed in front of the bottom shell through a plurality of second screws.

In an embodiment, the plurality of second screws are screws tightened from a front side of the bottom shell.

In an embodiment, two adjacent sides of the cabinet are provided with a plurality of worm gear locks, the other two adjacent sides of the cabinet are provided with lock holes corresponding to the plurality of worm gear locks one-to-one, each worm gear lock includes a worm and a helical gear meshed with the worm, and when the worm is driven by the helical gear, the worm extends vertically from or retracts from a respective side.

In an embodiment, the helical gear is provided with an inner hexagonal through hole, and a front side of the cabinet and a rear side of the cabinet are both provided with openings communicating with the inner hexagonal through hole.

Besides, in order to achieve the above objective, the present disclosure provides a display screen, including: a plurality of the display panels as described above. Two adjacent display panels are connected through a locking cooperation between the worm gear lock and the lock hole.

The present disclosure provides a display panel and a display screen. The display panel includes a plurality of display modules and a cabinet. The plurality of display modules are distributed in a matrix, and are fixed in front of the cabinet. The cabinet is provided with two display module openings and a power supply assembly opening, and the two display module openings are provided at two sides of the power supply assembly opening. A protective cover plate is installed in front of the cabinet to cover the power supply assembly opening and form a power supply assembly cavity behind the cabinet, which is configured to install a power supply assembly. Two module opening cover plates are installed behind the cabinet to cover the two display module openings in a one-to-one correspondence. In this way, on one hand, when the display panel needs to be maintained, the user can stand in front of the display panel to maintain the parts, and only needs to take out the display modules in front of the display panel through the magnetic tool to maintain the display modules. Meanwhile, after the display modules are taken out, the user only needs to remove the protective cover in front of the cabinet to expose the power supply assembly to maintain the power supply assembly. On the other hand, when the display panel needs to be maintained, the user can stand behind the display panel to maintain the parts, and only need to directly remove the two module opening cover plates behind the cabinet to push out the display modules through the two display module openings to maintain the display modules. After the display modules are pushed out, the user can directly remove the power supply assembly behind the cabinet to maintain the power supply assembly. As can be seen, the technical solution can effectively solve the technical problem that for the same display panel, the user cannot both stand in front of the display panel to maintain the parts, and stand behind the display panel to maintain the parts, which easily affects the user experience.

BRIEF DESCRIPTION OF THE DRAWINGS

In order to more clearly illustrate the embodiments of the present disclosure or the technical solutions in the prior art, the following briefly introduces the accompanying drawings that need to be used in the description of the embodiments or the prior art. Obviously, the drawings in the following description are only some embodiments of the present disclosure. For those of ordinary skill in the art, other drawings can also be obtained from these drawings without creative labor.

DETAILED DESCRIPTION OF THE EMBODIMENTS

The specific embodiments of the present disclosure will be further described below with reference to the accompanying drawings. It should be noted that the description of these embodiments is for helping understanding of the present disclosure, but does not constitute a limitation to the present disclosure. Besides, the technical features involved in the various embodiments of the present disclosure described below can be combined with each other as long as there is no conflict with each other.

Figure 1:
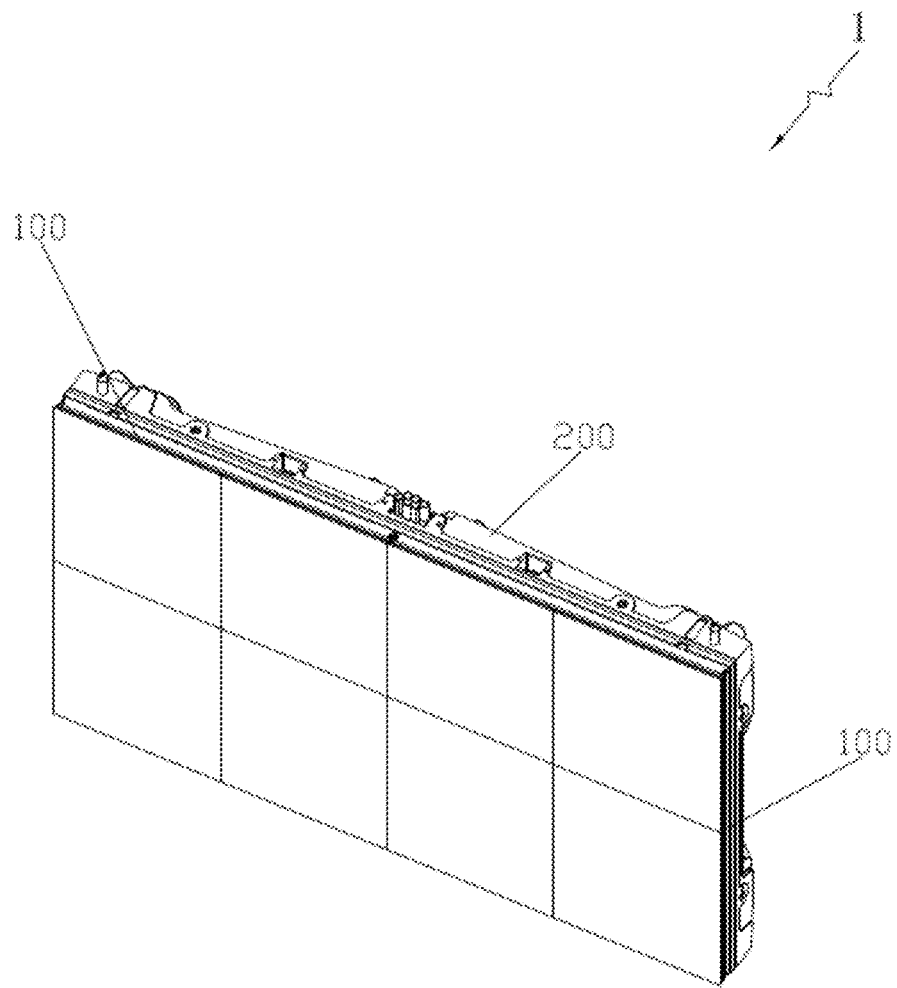
FIG. 1 is a schematic structural view of a display panel according to an embodiment of the present disclosure.
Figure 2:
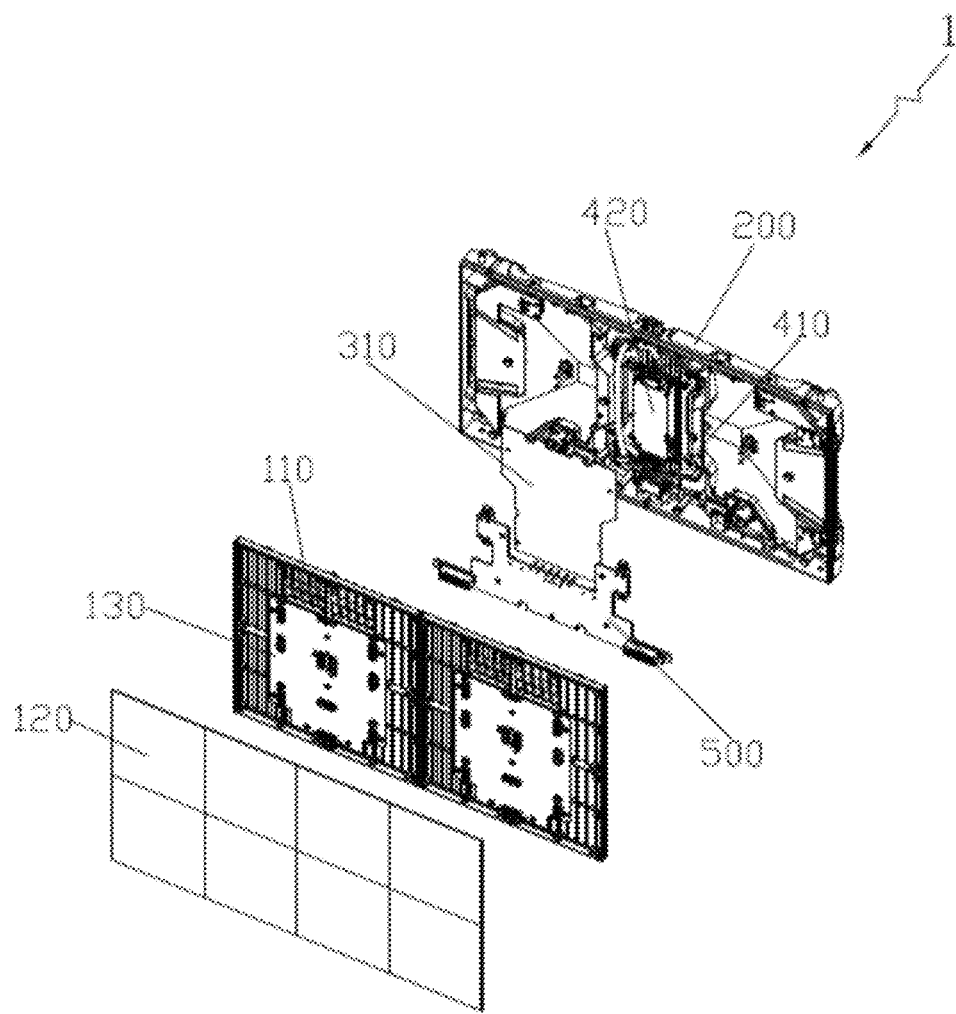
FIG. 2 is an exploded schematic structural view for maintaining the parts when the user stands in front of the display panel shown in FIG. 1.
Figure 3:
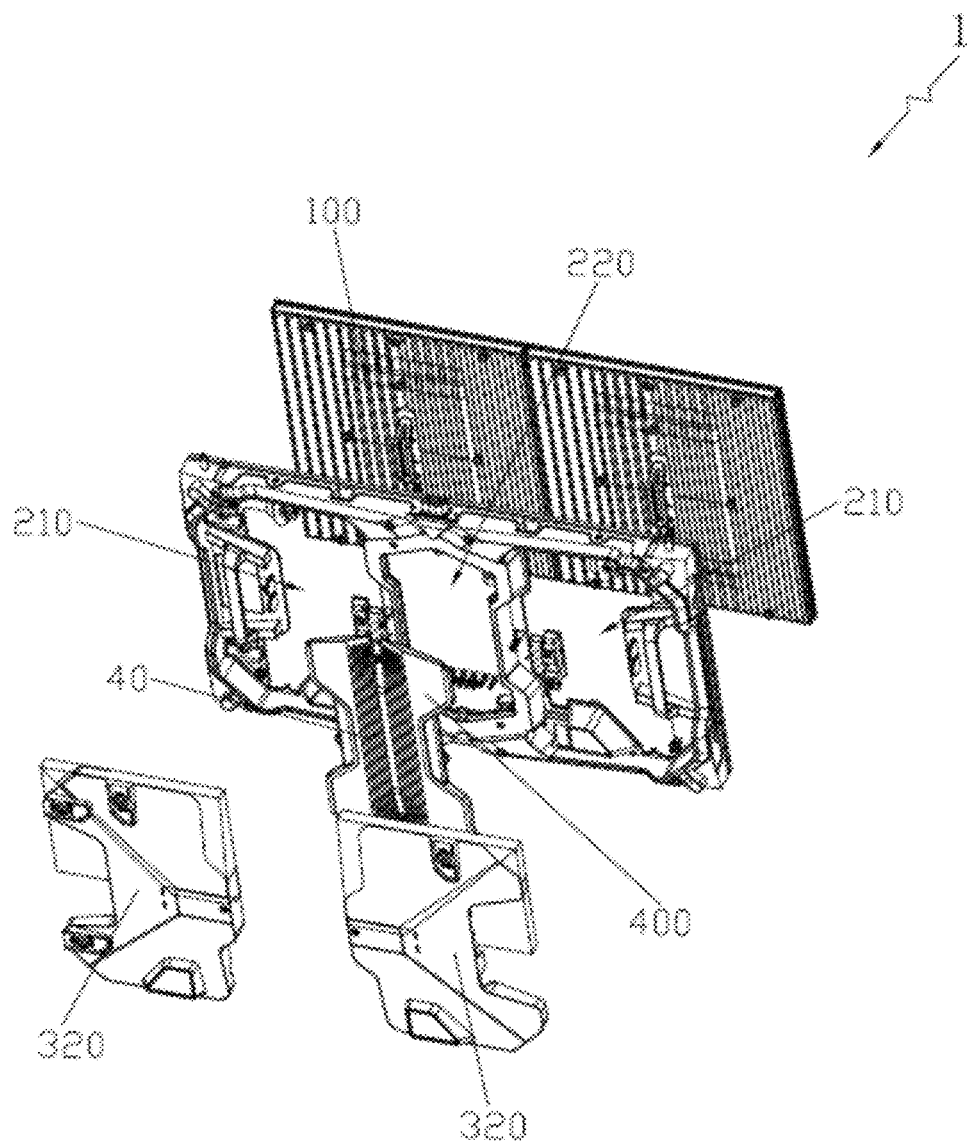
FIG. 3 is an exploded schematic structural view for maintaining the parts when the user stands behind the display panel shown in FIG. 1.

As shown in FIG. 1 to FIG. 3, the present disclosure provides a display panel 1. The display panel 1 includes a plurality of display modules 100 and a cabinet 200. The plurality of display modules 100 are distributed in a matrix, and are fixed in front of the cabinet 200. The cabinet 200 is provided with two display module openings 210 and a power supply assembly opening 220, and the two display module openings 210 are provided at two sides of the power supply assembly opening 220. A protective cover plate 310 is installed in front of the cabinet 200 to cover the power supply assembly opening 220 and form a power supply assembly cavity behind the cabinet 200, which is configured to install a power supply assembly 400. Two module opening cover plates 320 are installed behind the cabinet 200 to cover the two display module openings 210 in a one-to-one correspondence.

In this embodiment, as shown in FIG. 2 and FIG. 3, the display panel 1 includes two display modules 100 arranged side by side. The display panel 1 further includes a HUB control board 500 installed in front of the cabinet 200, and the HUB control board 500 is adjacent to the two display module openings 210. When the user needs to stand in front of the display panel to maintain the parts, the HUB control board 500 can be directly removed from the front side of the cabinet 200 for corresponding maintenance. When the user needs to stand behind the display panel to maintain the parts, the dismantling tool can be extended to the front side of the cabinet 200 through the two display module openings 210 behind the cabinet 200 to remove the HUB control board 500 for corresponding maintenance.

As shown in FIG. 2 and FIG. 3, the power supply assembly 400 includes a power supply box 410 and a power supply module 420. The power supply module 420 is fixed on the side surface of the power supply box 410 facing the protective cover plate 320. The edge of the power supply box 410 is fastened to the rear side of the cabinet 200 through a plurality of first screws (the plurality of first screws refer to the screws tightened from the rear side of the cabinet 200), which is convenient for maintenance personnel to directly remove the entire power supply box 410 and the power supply module 420 from the rear side of the cabinet 200 to perform corresponding maintenance. The side surface of the power supply box 410 away from the protective cover plate 310 is provided with a plurality of reinforcing ribs 40, which can strengthen and protect the overall structure of the power supply box 410 to a certain extent. The edges of the two module opening cover plates 320 are fastened to the rear side of the cabinet 200 through the plurality of first screws, which is convenient for maintenance personnel to directly remove the two module opening cover plates 320 from the rear side of the cabinet 200 to expose the two display module openings 210. Further, the two display module openings 210 are directly pushed forward and the two display modules 100 are removed for corresponding maintenance.

As shown in FIG. 1 and FIG. 2, the display module 100 includes a bottom shell 110 and at least one PCB module with LEDs 120, and the at least one PCB module with LEDs 120 is fixed in front of the bottom shell 110. In this embodiment, the display module 100 includes four PCB modules with LEDs 120, and the four PCB modules with LEDs 120 are all fixed in front of the bottom shell 110. The display module 100 further includes a HUB 130. The edge of the HUB 130 is fixed in front of the bottom shell 110 by a plurality of second screws (the plurality of second screws refer to the screws tightened from the front side of the bottom shell 110). When maintenance is performed, corresponding maintenance is directly performed on the HUB 130.

Figure 4:
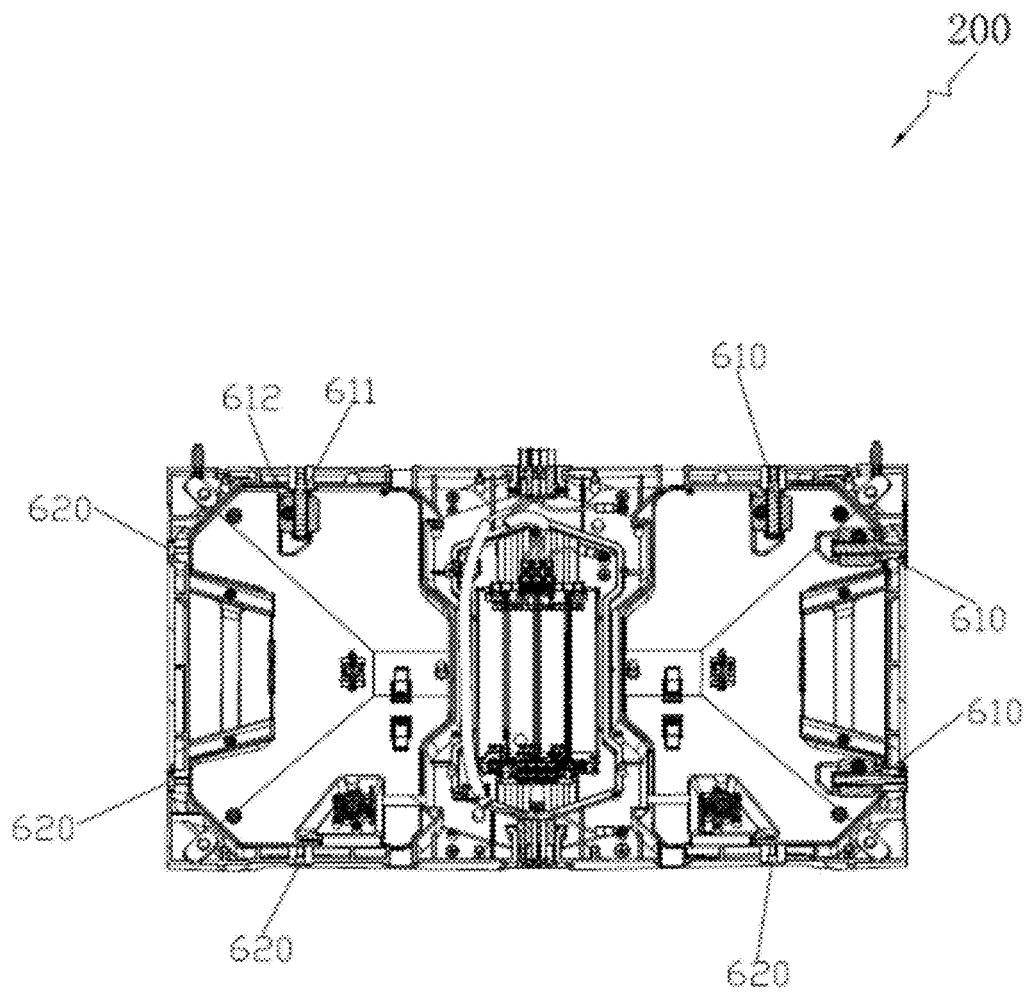
FIG. 4 is a schematic cross-sectional structural view of a cabinet of the display panel shown in FIG. 1.

As shown in FIG. 1 and FIG. 4, two adjacent sides of the cabinet 200 are provided with a plurality of worm gear locks 610. The other two adjacent sides of the cabinet 200 are provided with lock holes 620 corresponding to the plurality of worm gear locks 610 one-to-one. Each worm gear lock 610 includes a worm 611 and a helical gear 612 meshed with the worm 611, and when the worm 611 is driven by the helical gear 612, the worm 611 extends vertically from or retracts from a respective side. When a plurality of display panels 1 are spliced into one display screen, two adjacent display panels 1 can be tightly connected by the locking cooperation of the worm gear lock 611 and the lock hole 612. As shown in FIG. 4, the helical gear 612 is provided with an inner hexagonal through hole, and both a front side of the cabinet 200 and a rear side of the cabinet 200 are provided with openings communicating with the inner hexagonal through hole. When the boxes are spliced, the assembler can operate the helical gear 612 to rotate in front of the bottom shell 110 through the opening on the front side, and the worm 611 can extend vertically from the corresponding side, and extend into the lock hole 100 on the adjacent side for locking. The assembler can also operate the helical gear 612 to rotate behind the bottom shell 110 through the opening on the rear side, and the worm 611 can extend vertically from the corresponding side, and extend into the lock hole 100 on the adjacent side for locking. It can be seen that when the display panel 1 is spliced, the cabinet can be locked at the front and at the back, which provides great convenience to the assemblers.

In addition, the magnetic attraction structure mentioned in this embodiment may be a magnetic cooperation between a magnetic block and a magnetic block, or a magnetic cooperation between a magnetic block and an iron block.

The present disclosure further provides a display screen. The display screen includes a plurality of display panels 1. Two adjacent display panels 1 are connected through a locking cooperation between the worm gear lock 610 and the lock hole 620.

The present disclosure provides a display panel and a display screen. The display panel includes a plurality of display modules and a cabinet. The plurality of display modules are distributed in a matrix, and are fixed in front of the cabinet. The cabinet is provided with two display module openings and a power supply assembly opening, and the two display module openings are provided at two sides of the power supply assembly opening. A protective cover plate is installed in front of the cabinet to cover the power supply assembly opening and form a power supply assembly cavity behind the cabinet, which is configured to install a power supply assembly. Two module opening cover plates are installed behind the cabinet to cover the two display module openings in a one-to-one correspondence. In this way, on one hand, when the display panel needs to be maintained, the user can stand in front of the display panel to maintain the parts, and only needs to take out the display modules in front of the display panel through the magnetic tool to maintain the display modules. Meanwhile, after the display modules are taken out, the user only needs to remove the protective cover in front of the cabinet to expose the power supply assembly to maintain the power supply assembly. On the other hand, when the display panel needs to be maintained, the user can stand behind the display panel to maintain the parts, and only need to directly remove the two module opening cover plates behind the cabinet to push out the display modules through the two display module openings to maintain the display modules. After the display modules are pushed out, the user can directly remove the power supply assembly behind the cabinet to maintain the power supply assembly. As can be seen, the technical solution can effectively solve the technical problem that for the same display panel, the user cannot both stand in front of the display panel to maintain the parts, and stand behind the display panel to maintain the parts, which easily affects the user experience.

The embodiments of the present disclosure have been described in detail above with reference to the accompanying drawings, but the present disclosure is not limited to the described embodiments. For those skilled in the art, without departing from the principles and spirit of the present disclosure, various changes, modifications, substitutions and alterations can be made to these embodiments, which still fall within the protection scope of the present disclosure.

What is claimed is:

1. A display panel, comprising:
   a plurality of display modules; and
   a cabinet;
   wherein the plurality of display modules are distributed in a matrix, and are fixed in front of the cabinet;
   the cabinet is provided with two display module openings and a power supply assembly opening, and the two display module openings are provided at two sides of the power supply assembly opening;
   a protective cover plate is installed in front of the cabinet to cover the power supply assembly opening and form a power supply assembly cavity behind the cabinet, which is configured to install a power supply assembly;
   two module opening cover plates are installed behind the cabinet to cover the two display module openings in a one-to-one correspondence, and
   wherein the display module comprises a bottom shell and at least one printed circuit board (PCB) module with light-emitting diodes (LEDs), and the at least one PCB module with LEDs is fixed in front of the bottom shell.

2. The display panel of claim 1, further comprising:
   a HUB control board,
   wherein the HUB control board is installed in front of the cabinet, and the HUB control board is adjacent to the two display module openings.

3. The display panel of claim 1, wherein the power supply assembly comprises a power supply box and a power supply module, the power supply module is fixed on a side surface of the power supply box facing the protective cover plate, and an edge of the power supply box is fastened with a rear side of the cabinet through a plurality of first screws.

4. The display panel of claim 3, wherein the plurality of first screws are screws tightened from the rear side of the cabinet.

5. The display panel of claim 3, wherein a plurality of reinforcing ribs are provided on the side surface of the power supply box away from the protective cover plate.

6. The display panel of claim 3, wherein edges of the two module opening cover plates are fastened to the rear side of the cabinet through the plurality of first screws.

7. The display panel of claim 1, wherein the display module further comprises a HUB, and an edge of the HUB is fixed in front of the bottom shell through a plurality of second screws.

8. The display panel of claim 7, wherein the plurality of second screws are screws tightened from a front side of the bottom shell.

9. The display panel of claim 1, wherein at least one worm gear lock is provided on a side of a first cabinet, and a lock hole corresponding to the at least one worm gear lock is provided on a side of a second cabinet adjacent to the side of the first cabinet.

10. The display panel of claim 9, wherein the cabinet have four sides, two adjacent sides of the cabinet are provided with a plurality of worm gear locks, the other two adjacent sides of the cabinet are provided with lock holes corresponding to the plurality of worm gear locks one-to-one.

11. The display panel of claim 10, wherein each worm gear lock comprises a worm and a helical gear meshed with the worm, and when the worm is driven by the helical gear, the worm extends vertically from or retracts from a respective side.

12. The display panel of claim 11, wherein the helical gear is provided with an inner hexagonal through hole.

13. The display panel of claim 12, wherein both a front side of the cabinet and a rear side of the cabinet are provided with openings communicating with the inner hexagonal through hole.

14. A display screen, comprising:
    a plurality of the display panels of claim 1;
    wherein two adjacent display panels are connected through a locking cooperation between the worm gear lock and the lock hole.

* * * * *